United States Patent [19]

Moustakas et al.

[11] Patent Number: 4,508,609
[45] Date of Patent: Apr. 2, 1985

[54] METHOD FOR SPUTTERING A PIN MICROCRYSTALLINE/AMORPHOUS SILICON SEMICONDUCTOR DEVICE WITH THE P AND N-LAYERS SPUTTERED FROM BORON AND PHOSPHOROUS HEAVILY DOPED TARGETS

[75] Inventors: Theodore D. Moustakas; H. Paul Maruska, both of Annandale, N.J.

[73] Assignee: Exxon Research & Engineering Co., Florham Park, N.J.

[21] Appl. No.: 535,902

[22] Filed: Sep. 26, 1983

[51] Int. Cl.³ .................... C23C 15/00; H01L 31/18
[52] U.S. Cl. ............................ 204/192 S; 136/258; 357/2; 357/30
[58] Field of Search ............. 204/192 S, 192 P; 136/258 AM; 357/2, 30

[56] References Cited

U.S. PATENT DOCUMENTS 4,417,092 11/1983 Moustakas et al. ......... 136/258 AM

FOREIGN PATENT DOCUMENTS 57-187971 11/1982 Japan ..................... 136/258 AM

OTHER PUBLICATIONS

M. J. Thompson et al., "R.F. Sputtered Amorphous Silicon Solar Cells", *Proceedings, Int'l Photovoltaic Solar Energy Conf.* (1977), Reidel Pub. Co. (Dordrecht), pp. 231–240 (Aug. 1978).

S. R. Das et al., "Dependence of the Microstructure of Amorphous Silicon Thin Films Prepared by Planar RF Magnetron Sputtering on Deposition Parameters", *J. Appl. Phys.*, vol. 54, pp. 3101–3105 (1983).

*Primary Examiner*—Aaron Weisstuch
*Attorney, Agent, or Firm*—Ronald D. Hantman

[57] ABSTRACT

A silicon PIN microcrystalline/amorphous silicon semiconductor device is constructed by the sputtering of N, and P layers of silicon from silicon doped targets and the I layer from an undoped target, and at least one semi-transparent ohmic electrode.

25 Claims, 7 Drawing Figures

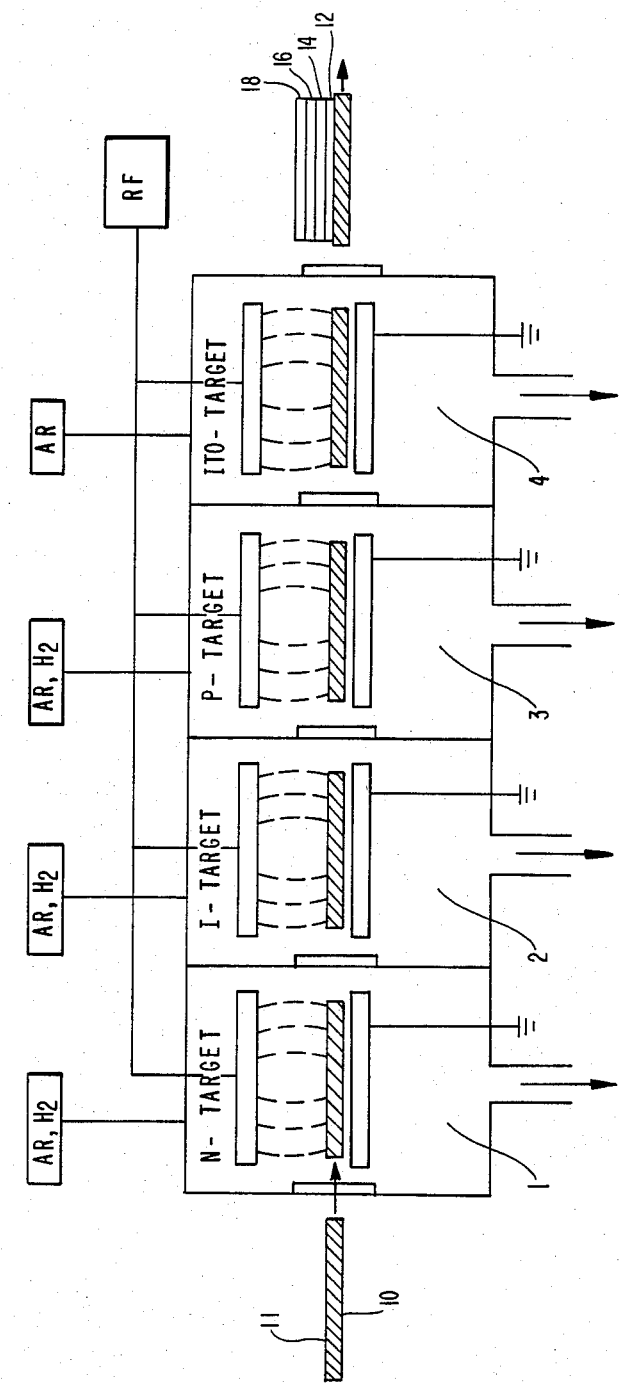
F I G. 1

METHOD FOR SPUTTERING A PIN MICROCRYSTALLINE/AMORPHOUS SILICON SEMICONDUCTOR DEVICE WITH THE P AND N-LAYERS SPUTTERED FROM BORON AND PHOSPHOROUS HEAVILY DOPED TARGETS

BACKGROUND OF THE INVENTION

The present invention results from research performed under U.S. Government Contract No. XZ-0-9219 for the Solar Energy Research Institute.

FIELD OF THE INVENTION

The present invention relates to a method for reactively sputtering a PIN amorphous silicon semiconductor device with the P and N-layers sputtered from boron and phosphorus heavily doped targets. The P, I and N-layers may all be amorphous or the P and (or) N-layers may be partially crystallized (microcrystalline).

Amorphous silicon PIN semiconductor devices are fabricated by two methods: One is the glow discharge decomposition of silane, which was described in a technical publication entitled "Factors Influencing the Efficiency of Amorphous Silicon Solar Cells" by David E. Carlson, *Journal of Non-Crystalline Solids* 35 and 36 (1980), 707–717. In this method the P and N layers are fabricated by mixing approximately 1 to 2% of $B_2H_6$ or $PH_3$ in the $SiH_4$ discharge. Another method is the reactive sputtering from a silicon target, which was described in a technical publication entitled "Amorphous Silicon PIN Solar Cells Fabricated by Reactive Sputtering" by T. D. Moustakas and R. Friedman, *Appl. Phys. Lett.* 40 (1982) 515–517. In this method the I-layer is sputtered from an intrinsic (undoped) target in an atmosphere containing argon and hydrogen and the P and N layers are sputtered again from an intrinsic target in an atmosphere containing, in addition to argon and hydrogen, approximately 0.1 to 1% of $B_2H_6$ or $PH_3$. Therefore, both methods of fabricating amorphous silicon PIN solar cells involve the handling of highly toxic gases, namely the $B_2H_6$ and $PH_3$.

The possibility of doping amorphous Si, by sputtering from Si doped targets, was first speculated upon in a technical publication "Doping of Sputtered Amorphous Semiconductors" by M. H. Brodsky and J. J. Cuomo, *IBM Technical Disclosure Bulletin* Vol. 19, (1977) p. 4802. In another technical publication entitled "Doping of Sputtered Amorphous-Silicon Solar Cells" by M. J. Thompson et al, *Solid State and Electron Devices*, Vol. 2 (1978) p. S11, some preliminary doping effects from doped Si targets have been demonstrated.

Amorphous silicon P-I-N devices in which the P and N-layers are fabricated by sputtering from heavily doped silicon targets have not been demonstrated so far. Such P-I-N devices, in order to be used as solar cells, must have P and N-layers which are highly conductive and at least one of the layers from where the light enters the device must be highly transparent.

SUMMARY OF THE INVENTION

The invention is directed to a method for fabricating a silicon PIN semi-conductor device. The method of the present invention shall be illustrated and described with respect to a PIN device. It is to be understood, however, that the method of the present invention applies equally well to a NIP device.

An N layer is reactively sputtered from a heavily N-doped silicon target in an atmosphere containing argon and hydrogen. An intrinsic, I-layer, is also reactively sputtered from an undoped target in an atmosphere containing argon and hydrogen. The P layer is reactively sputtered from a heavily P-doped target and is deposited in an atmosphere containing argon and hydrogen. Sputtering the N and P layers from doped targets avoids the handling of toxic gases. In addition, proper choice of the deposition parameters leads to N and P layers that are either *amorphous* or *microcrystalline*, with optimum conductivity and optical properties for applications in PIN solar cells.

BRIEF DESCRIPTION OF THE DRAWINGS

FIG. 1 shows a schematic diagram of a multichamber sputtering unit for the deposition of a NIP/ITO amorphous silicon semiconductor device constructed according to the present invention.

DETAILED DESCRIPTION OF THE INVENTION

Figure 2:
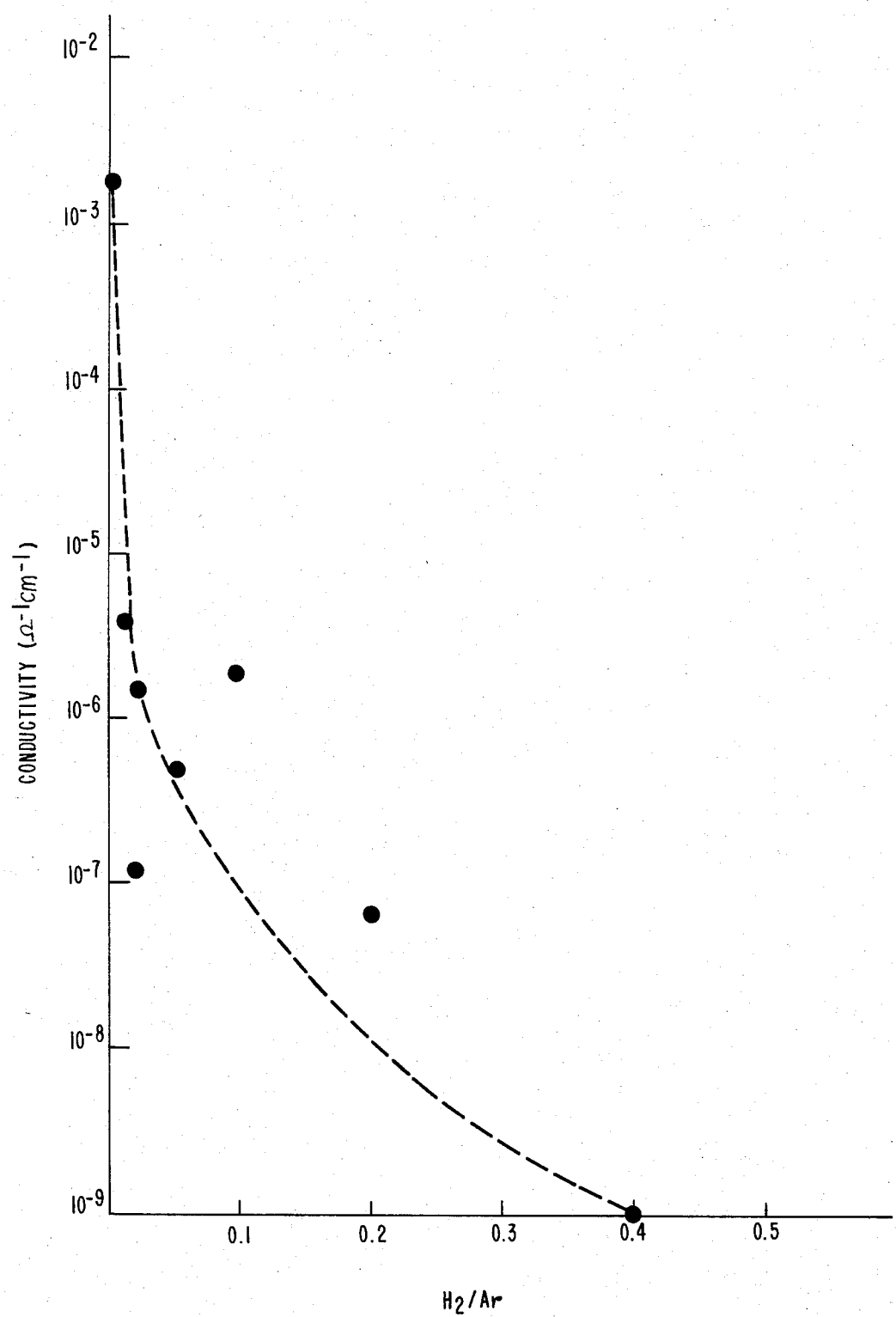
FIG. 2 shows the conductivity as a function of $H_2/Ar$ for phosphorus doped films.

FIG. 1 shows a schematic diagram of a multichamber sputtering unit for the deposition of an NIP semiconductor device according to the present invention. All three layers, N, I and P, are deposited in separate chambers to avoid cross-contamination between the layers. Each of the chambers is a conventional RF diode sputtering unit which is adapted to receive the appropriate atmosphere of argon and hydrogen.

It is also possible to use one vacuum chamber with three targets, each target activated sequentially to produce the three layers, P, I and N. In this situation, however, it is necessary to sputter clean the chamber between the first and second layers to avoid contamination of the I layer.

The phosphorus and boron doped targets were fabricated in a single crystal form by the Czochralski method. The phosphorus and boron impurities were added to the melt during the growth. The analysis of the single crystals indicate that the phosphorus doped target contains more than about $1 \times 10^{19}$ P-atoms/cm$^3$ and the boron doped target contains $1 \times 10^{19}$ B-atoms/cm$^3$. However, higher concentrations will produce more conductive P and N layers. Other methods of target fabrication are also possible. For example a boron doped target was fabricated by hot pressing powders of Si and B.

The sputtered amorphous silicon PIN device of the present invention includes a substrate 10 which generally comprises a physically supportive substrate for the overlying sputter deposited layers. Substrate 10 includes a major area coating surface which is substantially free from voids or protrusions of the order (in size) of the thickness of the overlying layers to avoid pin holes therethrough.

In one embodiment, substrate 10 may comprise a non-electroconductive material such as glass or ceramic for which an overlying layer of an electroconductive material is required. Alternatively, substrate 10 may comprise a metal concurrently serving as a supportive substrate and an electrode contact to the overlying layers. In either instance, the coating surface of the substrate is thoroughly cleaned to remove unwanted contamination of the coating surface. In a preferred embodiment, electrode 10 comprises a metal known to form an ohmic contact to N-doped silicon, such as molybdenum or stainless steel for example. In the case where substrate 10 comprises a nonelectroconductive material it is preferred that the overlying layer comprise a layer of metal known to form an ohmic contact to N-doped amorphous silicon, such as molybdenum or chromium thin films, or a transparent conductor such as ITO or tin oxide of approximately 1,000 Å thickness.

The substrates are fastened to the anode electrode of each of the conventional RF diode sputtering units which are adapted to provide controlled partial pressures of hydrogen and argon as detailed hereinafter. The term secured is intended in this application to mean both the physical securing of the substrate to the anode electrode and more importantly the electrical contacting of the conducting coating surface to the anode electrode. In this manner the coating surface is maintained at the approximate electrical potential of the anode electrode. The anode electrode is either electrically grounded or supplied with a positive or negative bias of approximately ±50 volts. The sputtering system is further adapted to provide for controlled temperature heating of the substrates. The deposition temperature as recited hereinafter is measured by a thermocouple embedded in the anode electrode.

It is to be recognized that the temperatures recited hereinafter are measured accordingly and the actual temperature of the depositing film may differ.

Two types of deposition conditions for the P and N layers have been identified. One set of conditions leads to films which are amorphous and the other set to films which are microcrystalline.

A. Amorphous N, I and P Silicon Films

Films deposited at low total pressure ($Ar+H_2<20$ mTorr) and $H_2/Ar<1$ were found by X-ray diffraction to be amorphous.

The sputtering system of chamber 1 is evacuated to a base pressure of about $1\times10^{-7}$ Torr by conventional mechanical and turbomolecular pumping means. An N layer 14 of hydrogenated amorphous silicon is sputter deposited by first heating the substrate to a monitored temperature ranging from about 200° C. to about 400° C. A sputtering target comprising a phosphorus-doped silicon disc about 5" in diameter is secured to the cathode electrode being located about 4.5 cm from the substrate platform (anode electrode).

The target is supplied with an RF power of about 100 to 200 watts, resulting in an induced DC bias of about −800 to −2,000 volts relative to the electrically grounded substrate platform (anode). These conditions lead to deposition rates between 1 to 10 Å/sec. The sputter deposition continues for a time ranging from about 1 min. to about 3 mins., resulting in a thickness of N-layer, 12, ranging from about 150 angstroms to about 500 angstroms. The substrate heating described heretofore continues throughout the deposition to maintain the monitored substrate temperature within the indicated range to maintain a proper level of hydrogenation of the depositing silicon.

The transport and optical properties of the N-layers produced as described above depend greatly on the amount of H in the discharge. This is demonstrated in FIGS. 2 and 3 where the conductivity and optical absorption constant are shown for films produced from the phosphorus doped target at different $H_2$/argon ratios and the same total pressure ($H_2+Ar=5$ mTorr).

Figure 3:
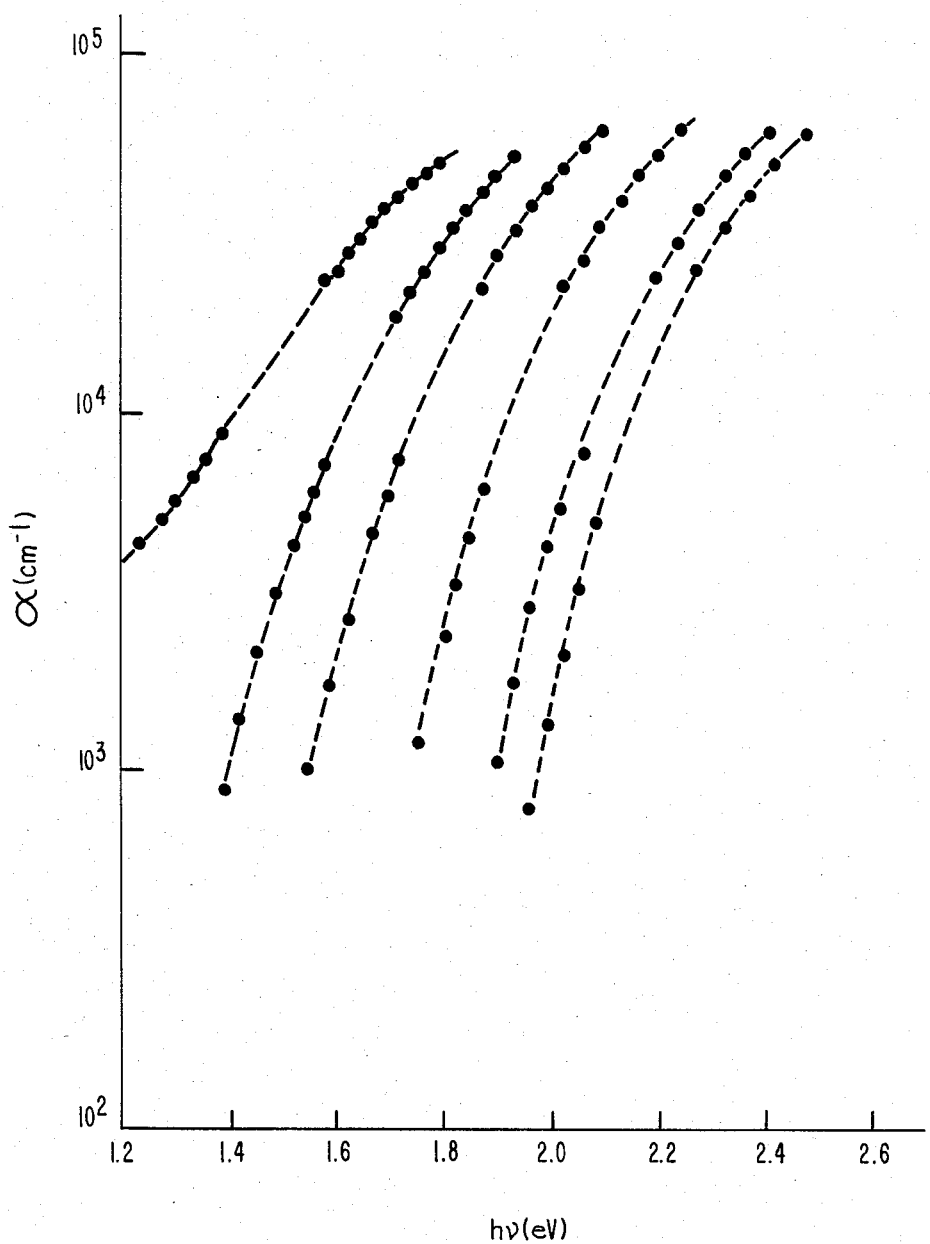
FIG. 3 shows the optical asorption as a function of photon energy for phosphorus doped films.

According to FIG. 2, although all the films have the same amount of incorporated phosphorus (determined by SIMS Analysis), the conductivity is decreased by orders of magnitude according to amount of H. This suggests that the H inhibits the phosphorus atoms from acting as donors. However, the most highly doped films have high optical absorption (see FIG. 3) and, therefore, are not suitable as a "window" material to allow entrance of light. Therefore, for solar cell applications, high conductivity films are suitable only as back contacts. However, the most highly doped films may be suitable for other applications of PIN devices which do not involve the absorption of light.

The substrate with the N-layer thereon next is moved to Chamber 2 where it is coated with an intrinsic layer. The intrinsic layer 14 of hydrogenated amorphous silicon is sputter deposited in an atmosphere containing pure argon and hydrogen. The sputtering atmosphere for depositing the intrinsic layer ranges from about 3 mTorr to about 15 mTorr of pure argon and from about 0.5 mTorr to about 1.0 mTorr of hydrogen. The RF power conditions, cathode and anode configuration, and substrate temperature are substantially identical to that described to the sputter deposition of the N-layer. However, the target in Chamber 2 is undoped crystalline silicon. Under these conditions, a layer of intrinsic amorphous silicon ranging from about 0.2 microns to about 1.5 microns in thickness is deposited.

The substrate is now moved to Chamber 3 where a P-layer is deposited onto the I-layer. The P-doped layer of hydrogenated amorphous silicon 16 is sputtered deposited from an atmosphere of argon and hydrogen whose total pressure is $Ar+H_2<20$ mTorr and $H_2/Ar<1$. The sputtering power conditions, monitored substrate temperature ranges, and configuration of the anode and cathode electrodes are substantially identical to that described for the deposition of the N and I layers. However, the target in Chamber 3 is a boron doped crystalline silicon. The thickness of the P-layer, as compared to the thickness of the intrinsic and N-doped layers is smaller, ranging from about 100 to about 150 angstroms. As presently understood, the P-layer functions to form a potential barrier with the I layer.

As in the N-layer, the transport and optical properties were found to depend greatly on the amount of H in the discharge. This is demonstrated in FIGS. 4 and 5, where the conductivity and optical absorption constant are shown for films produced from the boron doped target at different $H_2$/argon ratios and the same total pressure ($H_2+Ar=5$ mTorr).

Figure 4:
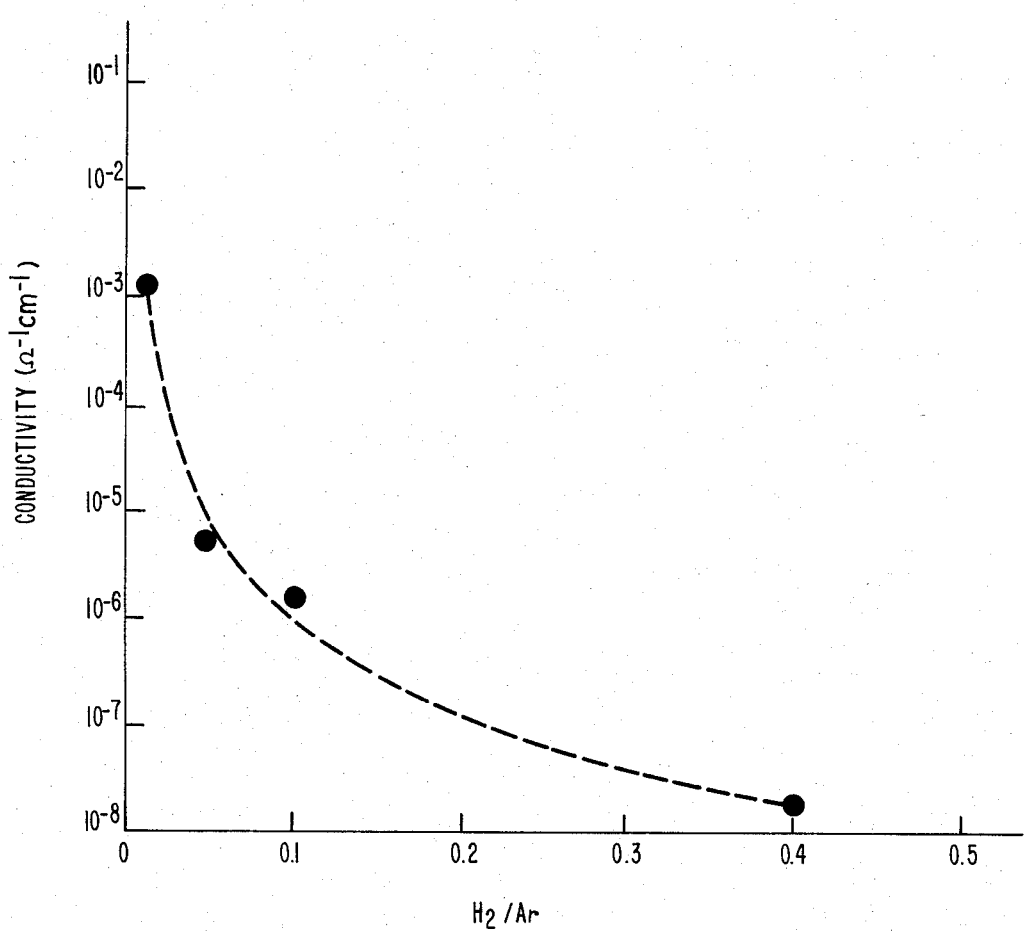
FIG. 4 shows the conductivity as a function of $H_2/Ar$ for boron doped films.
Figure 5:
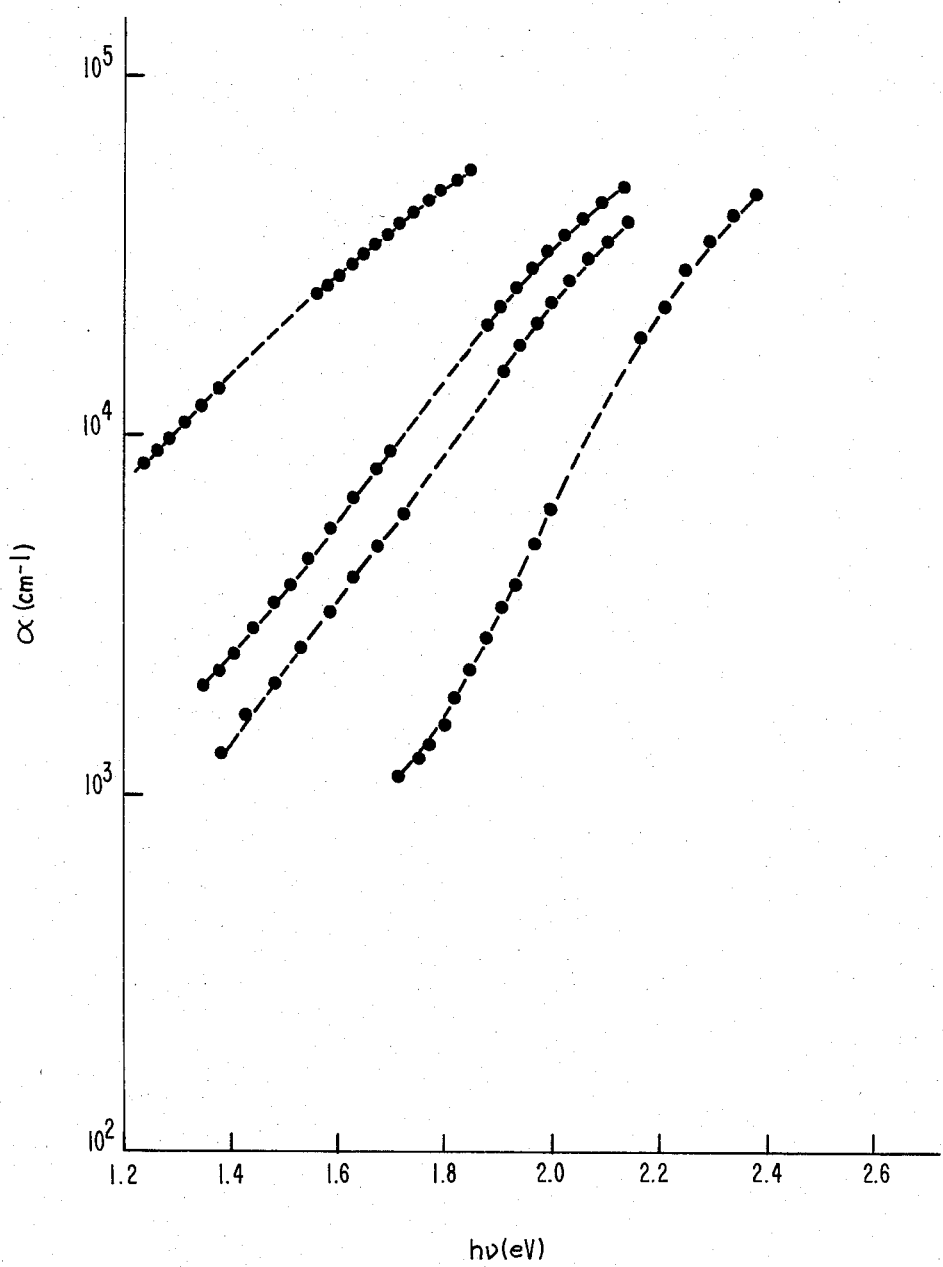
FIG. 5 shows the optical asorption as a function of photon energy for boron doped films.

According to FIG. 4, although all the films have the same amount of incorporated boron (determined by SIMS analysis), the conductivity is decreased by orders of magnitude according to amount of H. This suggests that the H inhibits the boron atoms from acting as acceptors. However, the most highly doped films have high optical absorption (see FIG. 5) and, therefore, are not suitable as a "window" material to allow entrance of light. Therefore, for solar cell applications, high conductivity films are suitable only for back contacts. However, the most highly doped films may be suitable for other applications of PIN devices which do not involve the absorption of light.

The PIN device is moved to Chamber 4 where a current collection electrode 18 is deposited onto the P-layer. The current collection electrode for solar cell applications is an electroconductive material which is semi-transparent in the spectral region ranging from about 3,500 angstroms to about 7,000 angstroms, which constitutes the principal absorption region of the underlying amorphous silicon film layers. Further, this electrode must form a substantially ohmic contact to the contiguous P-doped amorphous silicon. In one embodiment, the electrode may comprise a semi-transparent conductive oxide such as indium tin oxide, tin oxide, or cadmium stannate. In such embodiment, the thickness of the conductive oxide may be tailored to provide an anti-reflection coating to the underlying amorphous silicon surface. In an alternate embodiment, electrode 18 may comprise a relatively thin metallic layer, also being semi-transparent and forming an ohmic contact to P-doped amorphous silicon.

B. Microcrystalline N and P Silicon Films

Films deposited under total pressure $Ar+H_2<20$ mTorr and $H_2/Ar<<1$ were found by x-ray diffraction to be partially crystallized with 50 Å crystallites embedded into an amorphous matrix. In contrast to the amorphous films, these films can be both highly conductive and transparent.

Figure 6:
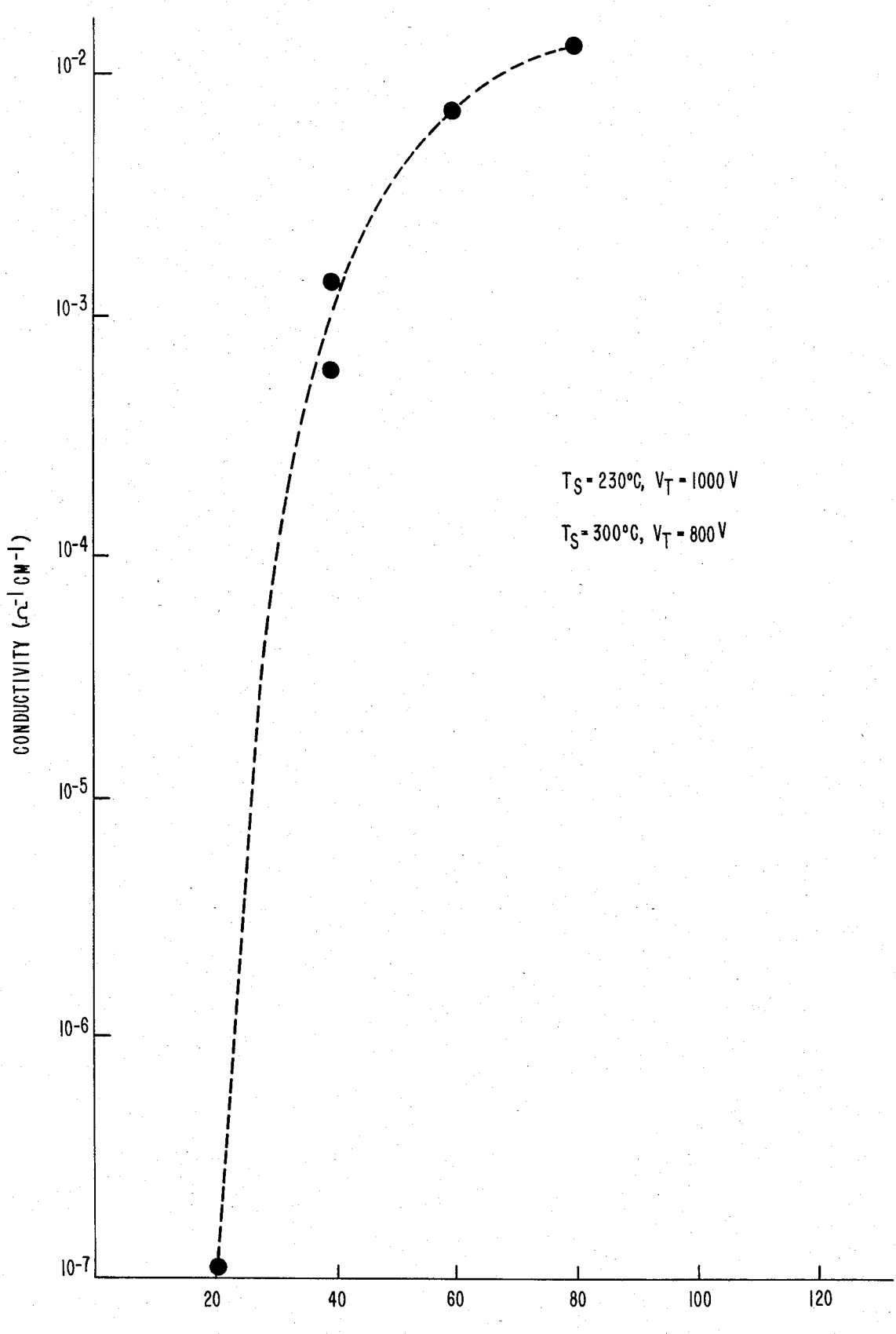
FIG. 6 shows, by means of the measured conductivity changes, the gradual transition from the amorphous to the microcrystalline phase as the total pressure in the discharge increases for boron doped films.

FIG. 6 shows the conductivity transition from the amorphous to the microcrystalline phase as the total pressure of the discharge is increased.

Therefore, in solar cell applications, microcrystalline films, being both conductive and highly transparent, are suitable for back contacts and front contact "windows".

The deposition rates of the microcrystalline films range from 10 A/min. to 50 A/min. and, therefore, the deposition of the N and P layers should be adjusted to result in film thickness of 100–200 Å.

All other conditions, sputtering power conditions, monitored substrate temperature ranges, and configuration of the anode and cathode electrodes are substantially identical to that described for the P, I and N layers for the amorphous films.

Those skilled in the art recognize that the use of a glass or other similarly transparent substrate 10, having an electroconductive layer 11, permits illumination of the device through the substrate. Furthermore, the deposition sequence of P and N layers may be reversed to deposit a layer of P amorphous (or microcrystalline) silicon onto an ITO coated substrate, having the intrinsic and N layers deposited thereupon.

It should be recognized that the sputtering techniques used in the construction of a photovoltaic device of the present invention result in enhanced physical integrity and adherence of the deposited films. The method manifests in an ability to sputter deposit a layer of semi-transparent conductive oxide such as indium tin oxide onto a relatively thin P doped layer, 16, without deteriorating the junction forming characteristics of the underlying amorphous silicon layers. Essentially the source illumination can be from the substrate side (glass+ITO) or from the top.

To further one skilled in the art in the practice of the present invention, the following example details a specific embodiment.

EXAMPLE

The substrate is a mirror polished stainless steel. The N-layer is 500 Å of a phosphorus doped film deposited under the conditions which lead to microcrystalline N-layer from a phosphorus doped target. The P-layer, about 100 Å thick, was also deposited under the conditions which lead to microcrystalline layer:

N-layer, Total Pressure=80 mTorr
$H_2/Ar=10$
RF Sputtering Power=80 Watts
Target Bias voltage=$-1000$ volts
Deposition temperature=325° C.

I layer, Total Pressure=5 mTorr
$H_2/Ar=0.20$
RF Sputtering Power=80 Watts
Target Bias voltage=$-1000$ Volts
Deposition temperature=325° C.

P-layer, Total pressure=80 mTorr
$H_2/Ar=10$
RF Sputtering Power=60 Watts
Target Bias voltage=$-800$ Volts
Deposition temperature=325° C.

A similar device with an amorphous N-layer has also been fabricated and has similar performance:

N-layer, Total Pressure=5 mTorr
$H_2/Ar=0.1$
RF Sputtering Power=100 Watts
Target Bias voltage=$-1200$ Volts
Deposition temperature=325° C.

Figure 7:
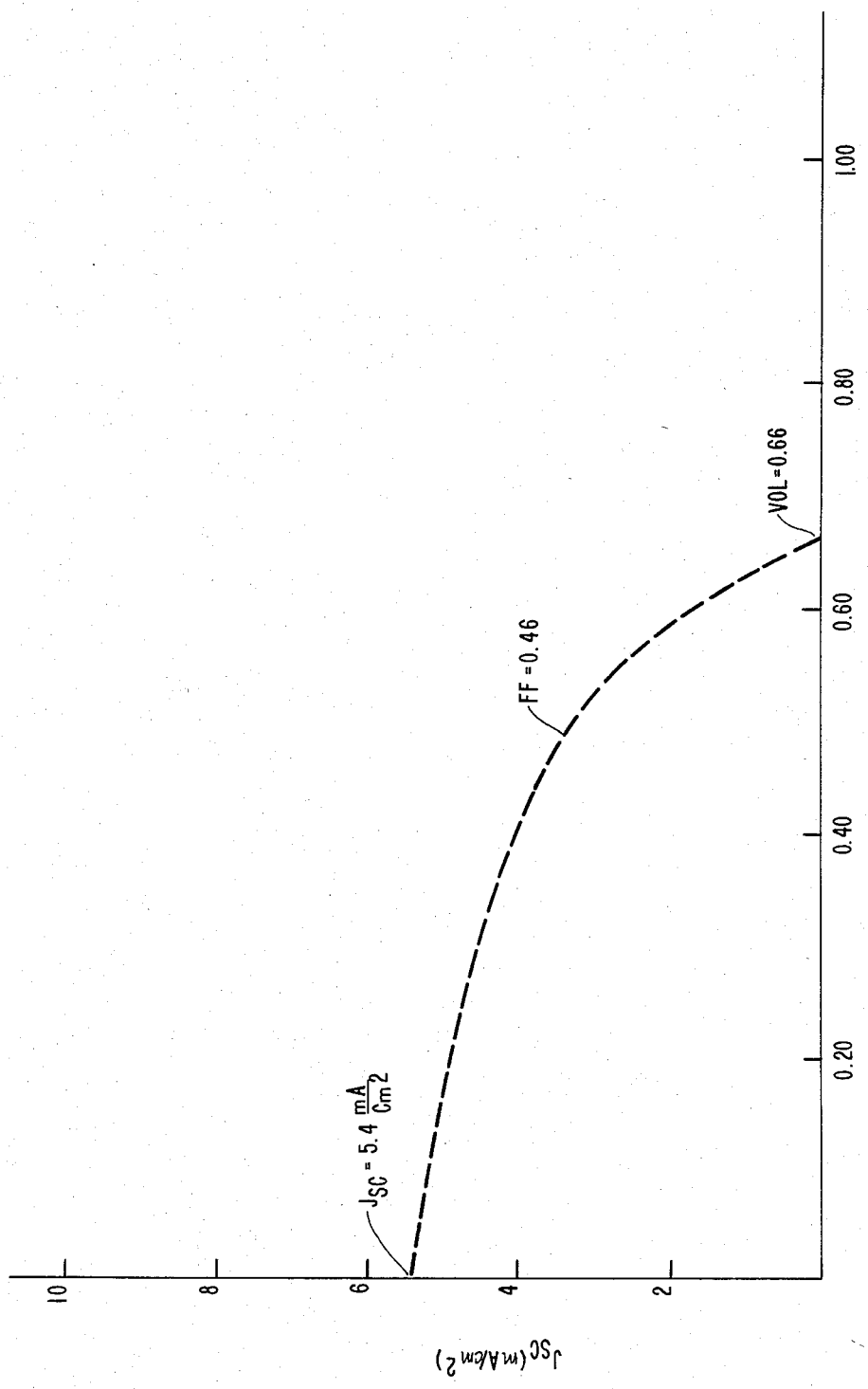
FIG. 7 shows the I-V characteristics of an NIP semiconductor device constructed according to the present invention.

FIG. 7 shows the I-V characteristics of the completed NIP solar cell. Both the N and the P layers are microcrystalline.

The top contact is a thin film of platinum instead of a transparent conductor (which acts as antireflecting coating). The optical losses in the platinum reduce the current by a factor of two. Thus, this device is actually capable of generating 11 mA/cm$^2$ with $V_{oc}=0.66$ and FF=0.46. These solar cell characteristics are comparable to devices fabricated by gas phase doping of the P and N-layers.

What is claimed is:

1. A metod for producing a hydrogenated silicon PIN semiconductor device comprising:
   providing a substrate having at least a surface region including an electroconductive material which forms an ohmic contact to doped silicon;
   reactively sputtering a layer of microcrystalline silicon doped with one type of charge carrier from a doped silicon target onto at least said surface region of the substrate in a total pressure of argon plus hydrogen >20 mTorr and $H_2/Ar>>1$;
   reactively sputtering a layer of amorphous intrinsic, I, silicon from an undoped silicon target onto said layer of silicon doped with said one type of charge carrier;
   reactively sputtering a layer of microcrystalline silicon doped with the other type of charge carrier from a doped silicon target onto said I layer in a total pressure of argon plus hydrogen >20 mTorr and $H_2/Ar>>1$;
   sputtering an electroconductive material onto at least a region of said layer of silicon doped with said other type of charge carrier, which material forms an ohmic contact thereto.

2. The method of claim 1 wherein said one type of charge carrier is N type and said other type of charge carrier is P type.

3. The method of claim 2 wherein said target for sputtering said silicon layer with said N-type of charge carrier contains more than $10^{19}$ phosphorus atoms/cm$^3$.

4. The method of claim 3 wherein an RF sputtering power of about 80 watts is coupled to the plasma, resulting in a target dc voltage of about $-1000$ volts.

5. The method of claim 4 wherein said substrate is maintained at a temperature ranging from about 200° C. to about 400° C. during said sputtering.

6. The method of claim 2 wherein said N doped layer of silicon ranges in thickness from about 150 to about 500 Angstroms.

7. The method of claim 2 wherein said reactive sputtering of the intrinsic, I, layer of silicon comprises sputtering silicon in partial pressures of hydrogen, ranging from about 0.5 mTorr to about 1.0 mTorr, and argon, ranging from about 3 mTorr to about 15 mTorr.

8. The method of claim 7 wherein said intrinsic layer ranges in thickness from about 0.2 μm to about 1.5 μm.

9. The method of claim 8 wherein an RF sputtering power of about 80 watts is used to sputter said silicon from an undoped target which is about five inches in diameter and located a distance of about 4.5 cm from said substrates.

10. The method of claim 7 wherein said substrate is maintained at a temperature ranging from about 200° C. to about 400° C. during said sputtering.

11. The method of claim 2 wherein said target for sputtering said silicon layer with said P-type of charge carrier contains more than $10^{19}$ boron atoms/cm$^3$.

12. The method of claim 11 wherein an RF sputtering power of about 60 watts is coupled to the plasma, resulting in a target dc voltage of about $-800$ volts.

13. The method of claim 12 wherein said substrate is maintained at a temperature ranging from about 200° C. to about 400° C. during said sputtering.

14. The method of claim 2 wherein said P doped layer of silicon ranges in thickness from about 100 to about 150 Angstroms.

15. The method of claim 14 wherein said P layer is about 100 Å in thickness.

16. The method of claim 2 wherein said electroconductive material, sputtered onto said P-doped silicon is a thin film of material selected from the group consisting of indium tin oxide, tin oxide, and cadmium stannate.

17. The method of claim 16 wherein said electroconductive material is a thin film of indium tin oxide.

18. The method of claim 1 wherein said one type of charge carrier is P type and said other type of charge carrier is N type.

19. The method of claim 18 wherein said target for sputtering said silicon layer with said N-type of charge carrier contains more than $10^{19}$ phosphorus atoms/cm$^3$.

20. The method of claim 19 wherein an RF sputtering power of about 80 watts is coupled to the plasma, resulting in a target dc voltage of about $-1000$ volts.

21. The method of claim 18 wherein said reactive sputtering of the intrinsic, I, layer of silicon comprises sputtering silicon in partial pressures of hydrogen, ranging from about 0.5 mTorr to about 1.0 mTorr, and argon, ranging from about 3 mTorr to about 15 mTorr.

22. The method of claim 18 wherein said target for sputtering said silicon layer with said P-type of charge carrier contains more than $10^{19}$ boron atoms/cm$^3$.

23. The method of claim 22 wherein an RF sputtering power of about 60 watts is coupled to the plasma, resulting in a target dc voltage of about $-800$ volts.

24. The method of claim 1 wherein said substrate is selected from the group consisting of Mo and stainless steel.

25. The method of claim 1 wherein said substrate comprises glass having an electroconductive coating of indium tin oxide, SnO$_2$, or cadmium stanate.

* * * * *